United States Patent
Rheem

(10) Patent No.: US 7,103,323 B2
(45) Date of Patent: Sep. 5, 2006

(54) APPARATUS FOR TRANSMITTING RF SIGNAL IN MOBILE COMMUNICATION TERMINAL AND METHOD FOR CONTROLLING THE SAME

(75) Inventor: Jae-Wook Rheem, Suwon-shi (KR)

(73) Assignee: Samsung Electronics Co., Ltd., (KR)

( * ) Notice: Subject to any disclaimer, the term of this patent is extended or adjusted under 35 U.S.C. 154(b) by 606 days.

(21) Appl. No.: 10/384,021

(22) Filed: Mar. 7, 2003

(65) Prior Publication Data

US 2004/0198252 A1    Oct. 7, 2004

(30) Foreign Application Priority Data

Apr. 19, 2002  (KR)  ............................... 2002-21649

(51) Int. Cl.
*H04B 1/02* (2006.01)
(52) U.S. Cl. ...................................... 455/91; 455/115.1
(58) Field of Classification Search .................. 455/91, 455/115.1, 115.3, 127.1, 127.2, 127.5, 295, 455/296
See application file for complete search history.

(56) References Cited

U.S. PATENT DOCUMENTS 6,853,690 B1 * 2/2005 Sorrells et al. ............... 455/91
2004/0192232 A1 * 9/2004 Szopko et al. ............... 455/91
2005/0048935 A1 * 3/2005 Sander et al. ............... 455/91

\* cited by examiner

*Primary Examiner*—Aung Moe
(74) *Attorney, Agent, or Firm*—Dilworth & Barrese LLP

(57) ABSTRACT

An apparatus for transmitting an RF signal in a mobile communication terminal and a method for controlling the same. The apparatus is insensitive to temperature variation simultaneously with satisfying a specification of a mobile communication system, and reduces noise simultaneously with preventing output power from bounding. The apparatus includes a step-up converter for converting a signal to be transmitted into a signal of a transmission band; a reverse variable attenuator for performing high attenuation or low attenuation about an output signal of the step-up converter according to an attenuation control value; a transmission power processor for raising power of an output signal of the reverse variable attenuator to transmission power; and a controller for generating the attenuation control value used for performing high attenuation if the signal to be transmitted requires a low output power level, whereas performing low attenuation if the signal to be transmitted requires a high output power level.

5 Claims, 4 Drawing Sheets

APPARATUS FOR TRANSMITTING RF SIGNAL IN MOBILE COMMUNICATION TERMINAL AND METHOD FOR CONTROLLING THE SAME

PRIORITY

This application claims priority to an application entitled "APPARATUS FOR TRANSMITTING RF SIGNAL IN MOBILE COMMUNICATION TERMINAL AND METHOD FOR CONTROLLING THE SAME", filed in the Korean Intellectual Property Office on Apr. 19, 2002 and assigned Serial No. 2002-21649, the contents of which are hereby incorporated by reference herein.

BACKGROUND OF THE INVENTION

1. Field of the Invention

The present invention relates to an apparatus for processing signals in a mobile communication terminal and a method for controlling the same, and more particularly to an apparatus for processing RF (Radio Frequency) transmission signals in a mobile communication terminal and a method for controlling the same.

2. Description of the Related Art

Typically, since a mobile terminal and a base station are spaced apart from each other at a predetermined distance in a mobile communication system, they perform a transmission/reception operation on a predetermined frequency band. That is, data transmission between the mobile terminal and the base station is performed using an RF signal of a predetermined frequency band. Noise is a greater problem in such a wireless communication system than a wired communication system because the data transmission is wirelessly performed. The noise may occur due to limitations of a channel environment or a transmitter.

The noise generated by the channel environment will be discussed below. The noise of the channel environment may be generated by interference between two similar frequencies in a radio channel, or may be generated by a topographical object, etc. The noise generated in the radio channel will be discussed below. Firstly, in case of a noise generated by the interference between two similar frequencies, a frequency band of data to be transmitted is raised to a predetermined frequency band and then the data is transmitted via the predetermined frequency band. Therefore, in the case where a signal having a frequency similar to the raised frequency band is adjacent to the signal of the data to be transmitted, signal interference may occur between the two signals under the condition that two wireless terminals using two similar frequencies are adjacent to each other. Next, as for the noise generated by a topographical object, data to be wirelessly transmitted is raised to a predetermined frequency band and then the data is transmitted via the predetermined frequency band. Since the data has a high frequency, noise may be caused by refraction and diffraction phenomena, and noise may be also caused by a time delay owing to a difference between transmission paths.

In the case of radio data transmission, besides the noise generated in the radio channel, noise is generated in a transmission device (i.e., a transmitter). The noise generated in the transmitter will be hereinafter described below. The noise generated in the transmitter occurs during signal step-up conversion or transmission amplification. Comparing the noise generated in the transmitter with the other noise generated in the other bands (except for a band of the transmitter in the case of a spreading spectrum system generally used), the noise generated in the transmitter comprises 80% of an overall noise factor. So, a mobile communication system makes all possible effort to remove such noise generated in the transmitter.

A detailed block diagram of such transmitter generally used for transmitting RF signals will hereinafter be described with reference to FIGS. 1 and 2. FIG. 1 is a block diagram of an RF transmitter for reducing noise in a mobile communication terminal.

Referring to FIG. 1, a baseband processor 10 converts baseband signals, i.e., data to be transmitted, into symbols. Such symbols generated from the baseband processor 10 are amplified in a variable amplifier 12, filtered in a BPF (Band Pass Filter) 14, and then input to a mixer 16. The mixer 16 converts the symbols of a baseband into RF signals of a predetermined band, that is, performs a step-up conversion from the baseband symbols to the RF signals of a predetermined band. The step-up converted signals, i.e., RF signals from the mixer 16, are filtered in a BPF 18, amplified in a variable amplifier 20, and then input to a fixed attenuator 22. The fixed attenuator 22 attenuates the received signals with a predetermined fixed attenuation value. The attenuated signals from the fixed attenuator 22 are input to a BPF 24, filtered in the BPF 24, and then input to a variable amplifier 26. Then, the variable amplifier 26 amplifies the received signals to make a predetermined gain value therein, and transmits the amplified signals to a power amplifier 28. The power amplifier 28 amplifies power levels of the amplified signals, and then transmits the resultant signals to an antenna.

The aforementioned circuit shown in FIG. 1 attempts to remove the noise generated in an RF transmitter by means of the fixed attenuator 22. Likewise, the fixed attenuator 22 can perform a sequential power adjustment in such a way that it satisfies an ACPR (Adjacent Channel Power Rejection Ratio) required by an RF specification (also called a spec) of a mobile communication system. However, the RF transmitter of FIG. 1 has a disadvantage in that it degrades a level of input power in accordance with an ACPR of a maximum output power because the fixed attenuator 22's value is always fixed to a predetermined value. Also, the RF transmitter of FIG. 1 has a further disadvantage in that it has a high power variation at a low temperature.

FIG. 2 is a view illustrating a block diagram of another RF transmitter for reducing noise in a mobile communication terminal. Comparing the RF transmitter of FIG. 1 with the RF transmitter of FIG. 2, the RF transmitter of FIG. 2 adopts a drive amplifier 50 whereas the RF transmitter of FIG. 1 adopts a fixed attenuator 22. Except for this difference between them, the components of RF transmitter of FIG. 2 are the same as the RF transmitter of FIG. 1. The drive amplifier 50 adopts a step gain adjustment method. The RF transmitter of FIG. 2 uses the drive amplifier 50, thereby using less power, improving its temperature characteristic, and simplifying a control circuit. The drive amplifier 50 has an unavoidable discontinuity in the case of adjusting a power level because it adopts the step gain adjustment method. As a result, in the case of measuring an RF signal such as a signal "open_loop_time_response", the output power may suddenly rise or spike. This may result in exceeding the power range required by an RF specification of a mobile communication terminal.

SUMMARY OF THE INVENTION

Therefore, the present invention has been made in view of the above problems, and it is an object of the present invention to provide an RF transmitter for satisfying a specification of a mobile communication system while simultaneously reducing noise, and a method for controlling the same.

It is another object of the present invention to provide an RF transmitter insensitive to a temperature variation that simultaneously reduces noise, and a method for controlling the same.

It is yet another object of the present invention to provide an RF transmitter for preventing an output power from spiking, and maintaining a linearity and discontinuity of a power level simultaneously with reducing noise, and a method for controlling the same.

In accordance with one aspect of the present invention, the above and other objects can be accomplished by the provision of an apparatus for transmitting an RF (Radio Frequency) signal in a mobile communication terminal. The apparatus comprises a step-up converter for converting a signal to be transmitted into a signal of a transmission band. A reverse variable attenuator performs high attenuation or low attenuation about an output signal of the step-up converter according to an attenuation control value. A transmission power processor raisespower of an output signal of the reverse variable attenuator to transmission power. A controller generates the attenuation control value used for performing high attenuation if the signal to be transmitted requires a low output power level, while performing low attenuation if the signal to be transmitted requires a high output power level.

Preferably, the apparatus for transmitting an RF signal in a mobile communication terminal may further include a memory for storing an attenuation ratio corresponding to a power level of a signal transmitted from the step-up converter to the reverse variable attenuator. The controller determines an attenuation value based on the attenuation ratio according to a power level of the signal being input to the reverse variable attenuator, and applies it.

Preferably, the reverse variable attenuator may include a first resistor, a second resistor and an inductor for receiving the attenuation control value, and transmitting it to an anode of a pin diode. A cathode of the pin diode is connected to a ground terminal via a third resistor. A first capacitor is connected between a contact point of the first and second resistors and the ground terminal. A second capacitor is connected to a contact point between the second resistor and the inductor. A third capacitor is connected between a contact point of the anode of the pin diode and the inductor, and the ground terminal. The cathode of the pin diode is also connected to an output terminal of the step-up converter and an input terminal of the transmission power processor.

In accordance with another aspect of the present invention, the above and other objects can be accomplished by the provision of a method for controlling an attenuation value of a reverse variable attenuator in a mobile communication terminal including a step-up converter for converting a signal to be transmitted into a signal of a transmission band. The reverse variable attenuator performs an attenuation operation about an output signal of the step-up converter upon receiving a control signal. A transmission power processor raises power of an output signal of the reverse variable attenuator to transmission power. The method for controlling the attenuation value of the reverse variable attenuator comprises the steps of: a) determining if a power level of a signal transmitted from the step-up converter to the reverse variable attenuator is lower than a predetermined threshold value; b) if the power level is lower than the predetermined threshold value, determining the attenuation value at an attenuation ratio higher than a predetermined attenuation ratio; c) determining if a power level of a signal transmitted from the step-up converter to the reverse variable attenuator is higher than a predetermined threshold value; and d) if the power level is higher than the predetermined threshold value, determining the attenuation value at an attenuation ratio lower than a predetermined attenuation ratio.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
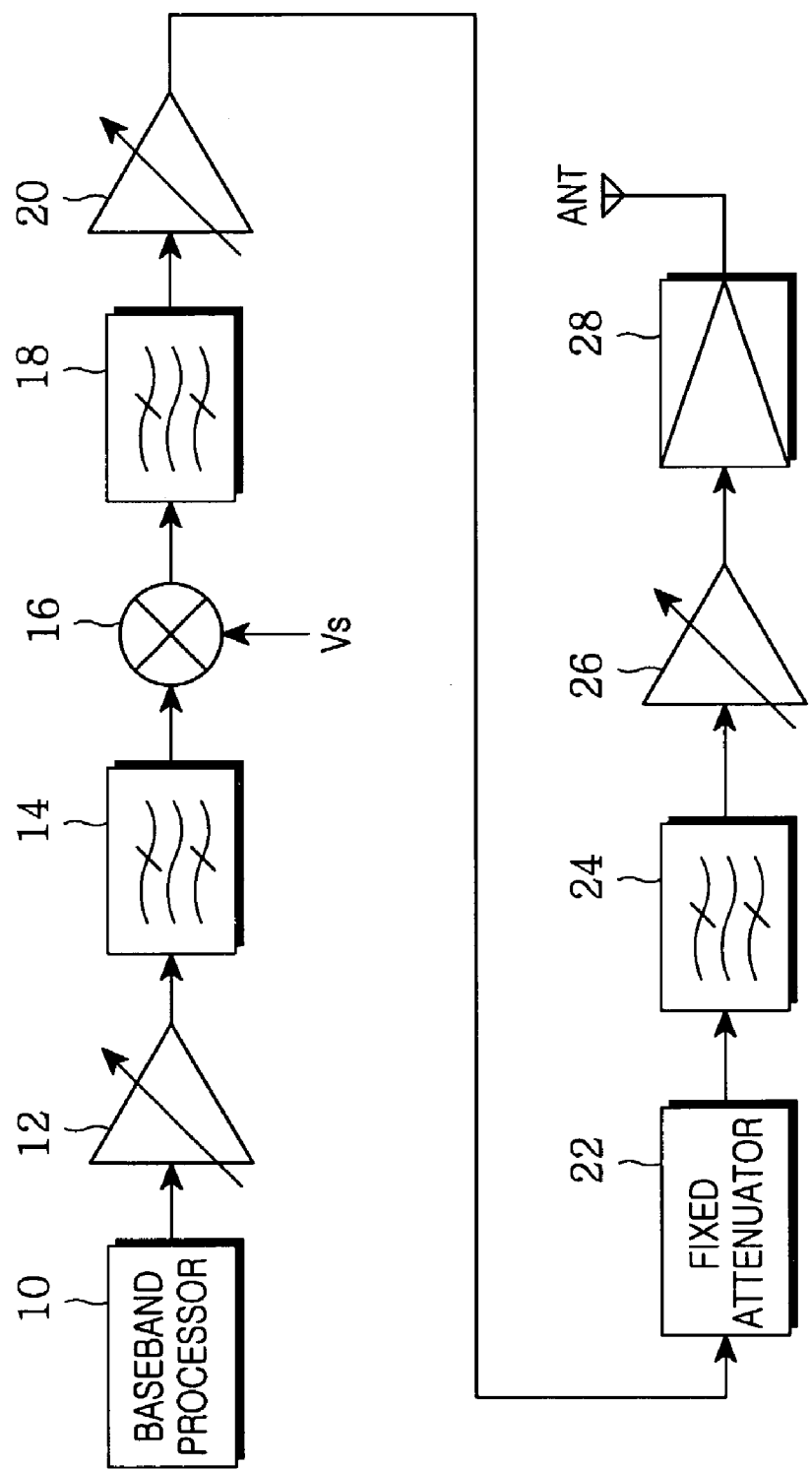
FIG. 1 is a view illustrating a block diagram of a conventional RF transmitter for reducing noise in a mobile communication terminal.
Figure 2:
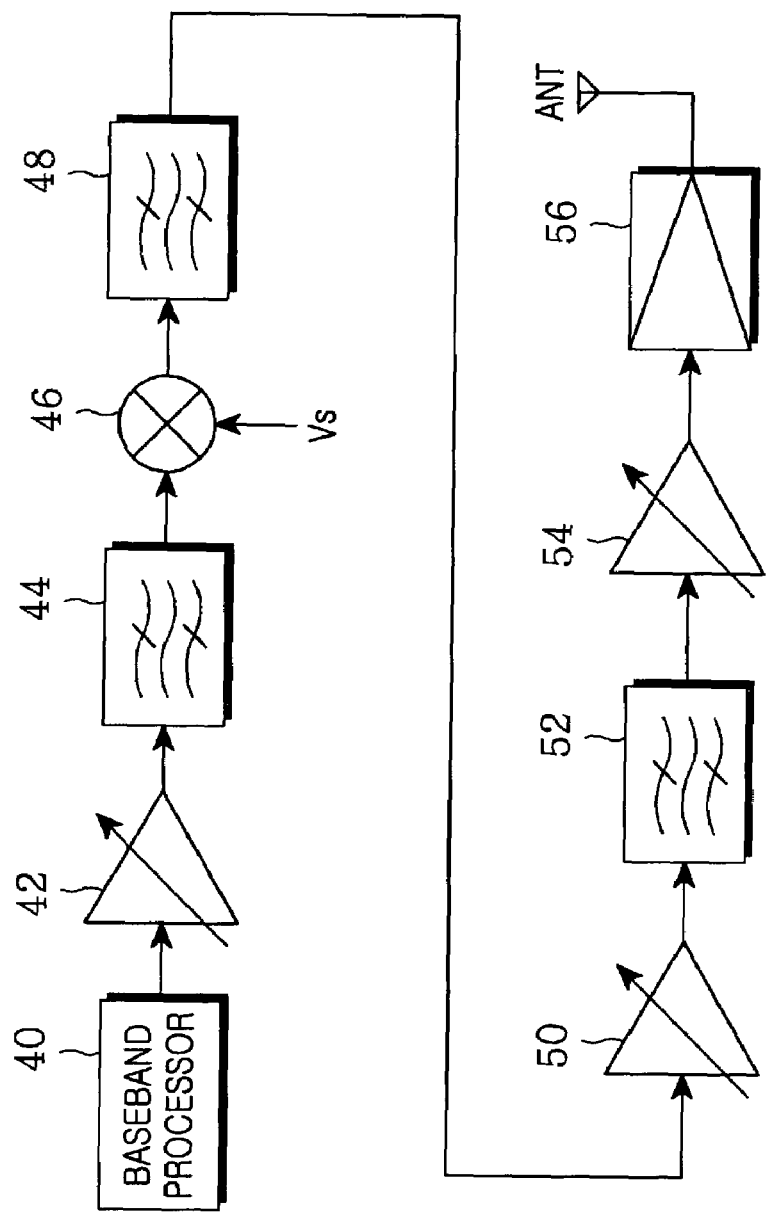
FIG. 2 is a view illustrating a block diagram of another conventional RF transmitter for reducing noise in a mobile communication terminal.

Preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted in order to focus on the subject matter of the present invention.

Figure 3:
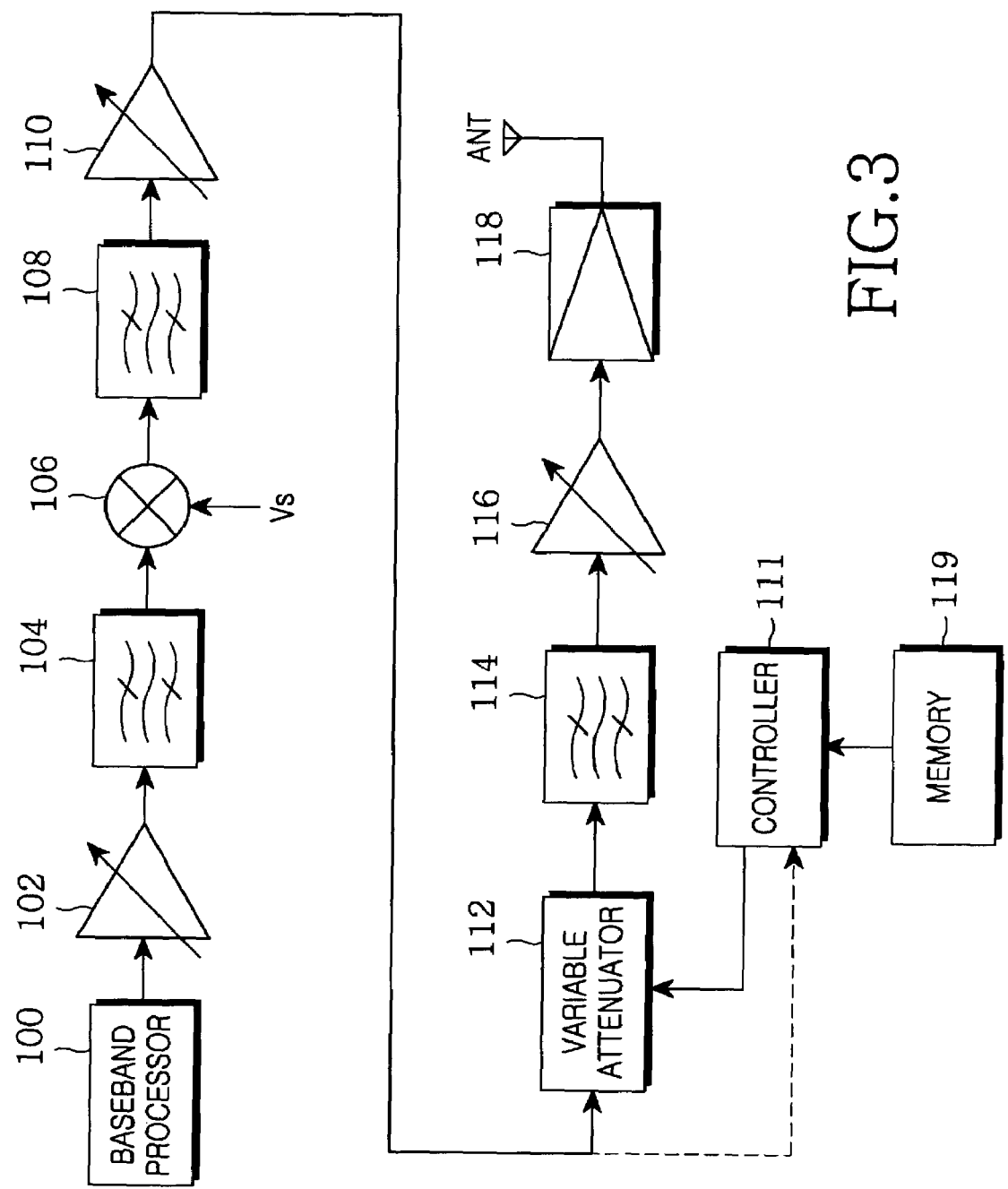
FIG. 3 is a view illustrating a block diagram of an RF transmitter for reducing noise in a mobile communication terminal in accordance with a preferred embodiment of the present invention.

FIG. 3 is a view illustrating a block diagram of an RF transmitter for reducing noise in a mobile communication terminal in accordance with a preferred embodiment of the present invention. A block diagram of an RF transmitter of a mobile communication terminal and operations for each block will hereinafter be described with reference to FIG. 3.

Referring to FIG. 3, a baseband processor 100 converts baseband signals, i.e., data to be transmitted, into symbols. The baseband processor 100 can be implemented with a BBA (Base Band Analog) chip in a mobile communication terminal. Such symbols processed in the baseband processor 100 are input to a variable amplifier 102. The variable amplifier 102 amplifies the received symbols with a predetermined amplification level, and then outputs the resultant signals to a BPF 104. The BPF 104 removes a noise component contained in the amplified symbols (that is, filters the received symbols), and then outputs the resultant signals to a mixer 106. The mixer 106 converts the symbols of a baseband into RF signals of a predetermined band, that is, performs a step-up conversion from the baseband symbols to the RF signals of a predetermined band, and then outputs the resultant signals to a BPF 108. The BPF 108 performs a filtering action for removing a spurious component from input signals in such a way that a noise component contained in a signal step-up conversion of the mixer 106 can be removed. The filtered signal output of the BPF 108 is input to a variable amplifier 110. The variable amplifier 110 amplifies the received signals with a predetermined power level, and outputs the resultant signals to a variable attenuator 112. Hereinafter, the components from the variable amplifier 102 to the variable amplifier 110 will be called a step-up converter. That is, the step-up converter indicates means for converting an output signal of the baseband processor 100 into an RF signal. Likewise, the signal processed by the step-up converter is input to the variable attenuator 112.

Typically, a SNR (Signal to Noise Ratio) is low at a low power level in an RF transmission stage RF_TX. Such SNR is dependent upon an overall system noise factor and an IMD (Inter Modulation Distortion) component. The present invention is directed toward controlling a power level about an offset frequency of 1.98 MHz from a center frequency of a signal channel. The power level is mainly determined by a system noise factor. As previously stated, as for the noise factor in a spreading spectrum system, a noise factor of the initial stages such as a RF_TX stage occupies 80% of an overall noise factor. Therefore, it is very important to lower a noise factor in the early stages, because noise generated in the step-up converter comprises 80% of an overall noise of a transmission signal.

In order to lower the noise of the transmission signal, the present invention is designed to input the step-up signal to a variable attenuator 112. The variable attenuator 112 varies its own attenuation value in response to an output value of a controller 111. That is, the variable attenuator 112 performs higher attenuation at a low output power level, but performs lower attenuation at a high output power level. Since a step-up converter has a low gain at a low output power level, a noise factor becomes higher, thereby lowering a SNR (also called C/N) of output power of the last stage. The controller 111 measures an output power value of the step-up converter. In this case, if the output power value of the step-up converter is higher than a predetermined power threshold value, the controller 111 generates a PDM (Pulse Duration Modulation) signal having an attenuation value lower than a predetermined attenuation threshold value. On the contrary, if the output power value of the step-up converter is lower than a predetermined power threshold value, the controller 111 generates a PDM signal having an attenuation value higher than the predetermined attenuation threshold value. Such attenuation value may be calculated by a predetermined equation in the controller 111, or may be determined by a memory 119. In other words, the relationship between the attenuation value and a power level is determined from a predetermined table, and is stored in a memory 119 on the basis of the predetermined table. Then, the controller 111 reads the value stored in the memory 119, and outputs an appropriate PDM signal having an attenuation value.

Figure 4:
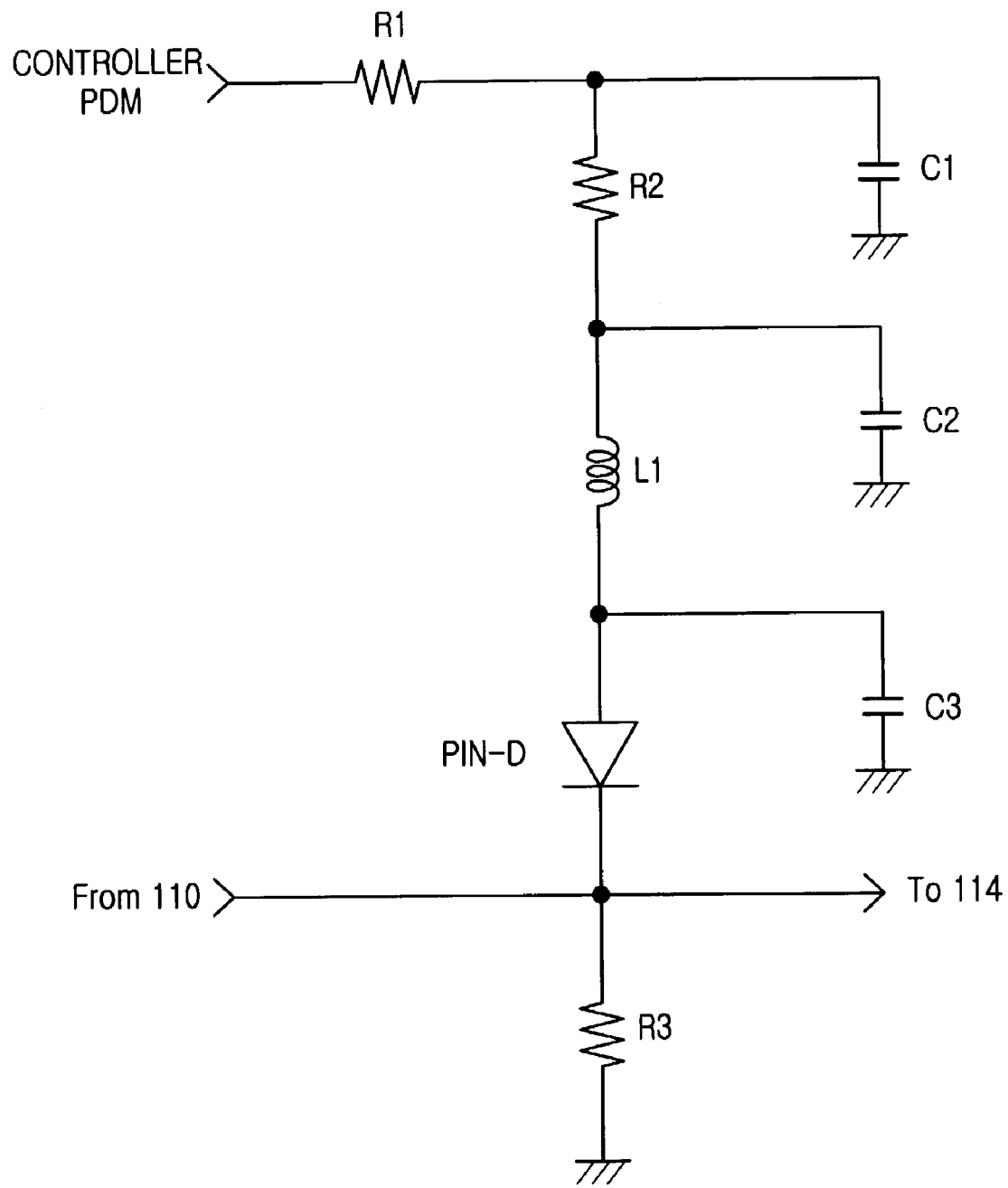
FIG. 4 is a view illustrating a detailed block diagram of a variable attenuator shown in FIG. 3 in accordance with a preferred embodiment of the present invention.

Prior to considering the next stages, a configuration of the variable attenuator 112 will hereinafter be described with reference to FIG. 4. FIG. 4 is a view illustrating a detailed block diagram of a variable attenuator 112 shown in FIG. 3 in accordance with a preferred embodiment of the present invention. A detailed circuit diagram of the variable attenuator 112 and its operation will hereinafter be described with reference to FIG. 4.

Referring to FIG. 4, a PDM signal indicating an output attenuation value of a controller 111 is connected to an anode of a pin diode PIN-D via a first resistor R1, a second resistor R2 and an inductor L1. A first capacitor C1 is connected to a contact point between first resistor R1 and second resistor R2, and a ground terminal. That is, the first capacitor C1 is connected between the contact point of R1 and R2, and the ground terminal. A second capacitor C2 is connected between a contact point of the second resistor R2 and the inductor L1, and a ground terminal. A third capacitor C3 is connected between a contact point of the inductor L1 and the pin diode PIN-D, and a ground terminal. A cathode of the pin diode PIN-D is grounded via a third resistor R3. A contact point between the cathode of the pin diode (PIN-D) and the third resistor R3 is connected to the variable amplifier 110, and is also connected to an input terminal of a BPF 114 positioned in the rear of the variable attenuator 112 of FIG. 3.

The first capacitor C1 to third capacitor C3 function as a bypass path for bypassing an AC frequency component of an output PDM signal of the controller 111. Also, the first resistor R1, the second resistor R2 and the inductor L1 establish a variable matching with the pin diode PIN-D. That is, the pin-diode PIN-D performs like a parallel connection between a variable resistor and a capacitor that takes into account an AC factor in response to a frequency component, thereby performing a matching action in response to an input signal characteristic. The third resistor R3 connected between the pin diode (PIN-D) and a ground terminal performs an impedance matching. The PDM signal generated from the controller 111 is variable according to a power level of a transmission signal. Therefore, an output signal of the variable amplifier 110 is attenuated by different matching values in response to output signals of the controller 111. As stated above, the present invention performs higher attenuation at a low output power level, but performs lower attenuation at a high output power level. As a result, the present invention performs linear signal attenuation simultaneously with satisfying an ACPR required by a standard specification of a mobile communication terminal, and also reduces noise. Further, since the present invention employs passive elements, it is insensitive to temperature variation.

As described above, the step-up converter has a high gain in the case of the same output power because a variable attenuator is connected after the step-up converter. Therefore, a noise factor of an overall system becomes lower as compared to a case having no attenuator, thereby enhancing a SNR (or C/N) of output lower. This effect brings about a high signal margin in the case of measuring each power level at −13 dBm spurious ACPR (Adjacent Channel Power Rejection or Adjacent Channel Protection Ratio). Such an attenuator for performing low attenuation at a high input power level and performing high attenuation at a low input power level is called a reverse variable attenuator in the present invention.

This reverse variable attenuator will be described with reference to FIG. 3. Referring again to FIG. 3, a signal attenuated in the reverse variable attenuator 112 is input to a BPF 114. The BPF 114 removes a noise component generated in the attenuation step of the reverse variable attenuator 112, and then outputs a signal having no noise to a variable amplifier 116. The variable amplifier 116 amplifies the signal by a predetermined value, and outputs the amplified signal to a power amplifier 118. The power amplifier 118 amplifies a power level of the received signal to a power level required for signal transmission, and transmits the result signal having the amplified power level. The BPF 114 for filtering an output signal of the reverse variable attenuator 112, the variable amplifier 116, and the power amplifier 118 function as a transmission power processor for transmitting a signal with a transmission power level. That is, the term "transmission power processor" means a processor for converting a signal to be transmitted to an appropriate predetermined transmission power level.

As apparent from the above description, the present invention effectively reduces noise simultaneously with satisfying the mobile communication standards because it adapts a reverse variable attenuator to an RF circuit of a mobile communication terminal.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for transmitting an RF (Radio Frequency) signal in a mobile communication terminal, comprising:
    a step-up converter for converting a signal to be transmitted into a signal of a transmission band;
    a reverse variable attenuator for performing high attenuation or low attenuation about an output signal of the step-up converter according to an attenuation control value;
    a transmission power processor for raising power of an output signal of the reverse variable attenuator to transmission power; and
    a controller for generating the attenuation control value used for performing said high attenuation with respect to a predetermined attenuation threshold value if the signal to be transmitted requires a low output power level with respect to a predetermined power threshold, whereas performing said low attenuation with respect to the predetermined attenuation threshold value if the signal to be transmitted requires a high output power level with respect to the predetermined power threshold value.

2. The apparatus as set forth in claim 1, wherein the reverse variable attenuator includes:
    a first resistor, a second resistor and an inductor for receiving the attenuation control value, and transmitting it to an anode of a pin diode;
    a cathode of the pin diode connected to a ground terminal via a third resistor;
    a first capacitor connected between a contact point of the first and second resistors, and the ground terminal;
    a second capacitor connected to a contact point between the second resistor, and the inductor; and
    a third capacitor connected between a contact point of the anode of the pin diode, and the inductor and the ground terminal,
    where the cathode of the pin diode is connected to an output terminal of the step-up converter and an input terminal of the transmission power processor.

3. The apparatus as set forth in claim 1, further comprising:
    a memory for storing an attenuation ratio corresponding to a power level of a signal transmitted from the step-up converter to the reverse variable attenuator, whereby the controller reads an attenuation value based on the attenuation ratio according to a power level of the signal being input to the reverse variable attenuator, and applies the attenuation ratio to the signal.

4. The apparatus as set forth in claim 1, wherein the attenuation control value uses a PDM (Pulse Duration Modulation) signal.

5. In a mobile communication terminal including a step-up converter for converting a signal to be transmitted into a signal of a transmission band; a reverse variable attenuator for performing an attenuation operation about an output signal of the step-up converter upon receiving a control signal; and a transmission power processor for raising power of an output signal of the reverse variable attenuator to transmission power, a method for controlling an attenuation value of the reverse variable attenuator, comprising the steps of:
    a) determining if a power level of a signal transmitted from the step-up converter to the reverse variable attenuator is lower than a predetermined power threshold value;
    b) if the power level is lower than the predetermined power threshold value, determining the attenuation value at an attenuation ratio higher than a predetermined attenuation ratio;
    c) determining if a power level of a signal transmitted from the step-up converter to the reverse variable attenuator is higher than the predetermined power threshold value; and
    d) if the power level is higher than the predetermined threshold value, determining the attenuation value at an attenuation ratio lower than the predetermined attenuation ratio.

* * * * *